United States Patent
Johnson et al.

[11] Patent Number: 6,043,691
[45] Date of Patent: Mar. 28, 2000

[54] PULSE SHAPER CIRCUIT

[75] Inventors: Bret Johnson; Ralf Schneider, both of München, Germany

[73] Assignee: Siemens Aktiengesellschaft, Munich, Germany

[21] Appl. No.: 09/160,862

[22] Filed: Sep. 25, 1998

[30] Foreign Application Priority Data

Sep. 30, 1997 [DE] Germany .............................. 197 43 298

[51] Int. Cl.⁷ .................................................. H03K 17/16
[52] U.S. Cl. ............................ 327/112; 327/437; 330/265
[58] Field of Search ............................ 327/108–112, 379, 327/389, 437; 330/265, 271

[56] References Cited

U.S. PATENT DOCUMENTS

| 5,191,245 | 3/1993 | Kang ........................................ 327/262 |
| 5,198,710 | 3/1993 | Houston .................................. 327/552 |
| 5,610,548 | 3/1997 | Masleid ................................... 327/112 |
| 5,760,618 | 6/1998 | Deliyannides et al. ................. 327/108 |

FOREIGN PATENT DOCUMENTS

| 0 434 380 A1 | 6/1991 | European Pat. Off. . |
| 0 458 766 A1 | 11/1991 | European Pat. Off. . |
| 32 39 936 A1 | 5/1984 | Germany . |
| 44 43 954 A1 | 6/1995 | Germany . |

OTHER PUBLICATIONS

Patent Abstracts of Japan No. 07–193475 A (Tadaaki), dated Jul. 28, 1995.
Patent Abstracts of Japan No. 63–240207 A (Sakurai), dated Oct. 5, 1988.

*Primary Examiner*—Kenneth B. Wells
*Attorney, Agent, or Firm*—Herbert L. Lerner; Laurence A. Greenberg; Werner H. Stemer

[57] ABSTRACT

A pulse shaper circuit includes a buffer having an input, an output and two supply connections. A controllable first switch is connected between one of the supply connections and a first supply potential, a controllable second switch is connected between the other supply voltage connection and a second supply potential, a controllable third switch is connected between the output of the buffer and the first supply potential and a controllable fourth switch is connected between the output of the buffer and the second supply potential. A control device for the switches is connected to the output of the buffer and produces a first control pulse of a specific duration at the occurrence of first edges of a signal present at the output of the buffer and a second control pulse of a specific duration at the occurrence of second edges. The first control pulse changes over the first switch from the ON state to the OFF state and the fourth switch from the OFF state to the ON state. The second control pulse changes over the second switch from the ON state to the OFF state and the third switch from the OFF state to the ON state.

5 Claims, 2 Drawing Sheets

PULSE SHAPER CIRCUIT

BACKGROUND OF THE INVENTION

Field of the Invention

The invention relates to a pulse shaper circuit.

A frequent problem in digital circuits is caused by so-called glitches, which occur particularly at the switching edges of a digital signal and distort the actual digital signal by overshooting in the positive or negative direction. The causes of glitches are many, and consequently they can only be prevented from occurring with difficulty. However, the occurrence of glitches can seriously impair the operation of digital circuits.

SUMMARY OF THE INVENTION

It is accordingly an object of the invention to provide a pulse shaper circuit, which overcomes the hereinafore-mentioned disadvantages of the heretofore-known devices of this general type and which eliminates glitches from a digital signal.

With the foregoing and other objects in view there is provided, in accordance with the invention, a pulse shaper circuit, comprising a buffer having an input, an output and two supply connections; a controllable first switch connected between one of the supply connections and a first supply potential; a controllable second switch connected between the other of the supply voltage connections and a second supply potential; a controllable third switch connected between the output of the buffer and the first supply potential; a controllable fourth switch connected between the output of the buffer and the second supply potential; and a control device connected to the output of the buffer for controlling the switches, the control device producing a first control pulse of a specific duration at an occurrence of first edges of a signal present at the output of the buffer, the first control pulse changing over the first switch from an ON state to an OFF state and changing over the fourth switch from an OFF state to an ON state, and the control device producing a second control pulse of a specific duration at an occurrence of second edges of the signal present at the output of the buffer, the second control pulse changing over the second switch from an ON state to an OFF state and changing over the third switch over from an OFF state to an ON state.

In the pulse shaper circuit according to the invention, only one buffer is connected between the output and the input. The other circuit sections produce a pulse of a specific length with each edge change of the input signal. This pulse blocks the buffer and does not allow any new edge change at the output of the buffer. It is only after the dead time defined by the pulse length that the buffer becomes active again, and the state of the output is dependent on the input state again. The dead time is controlled in this manner both for rising and for falling edges of the input signal. Advantageously, the pulse shaper circuit according to the invention can be incorporated directly into the signal path and causes only a minimal additional delay, since there is only one buffer in the signal path.

In accordance with another feature of the invention, the first and third switches are formed by respective first and third transistors of a first conduction type, and the second and fourth switches are formed by respective second and fourth transistors of a second conduction type, the control connections of the first and fourth transistors are connected to one another and are controlled by the first control pulse, and the control connections of the second and third transistors are connected to one another and are controlled by the second control pulse.

In accordance with a further feature of the invention, the control circuit includes a NOR gate having an output which is coupled to the control connection of the first and fourth transistors, and a NAND gate having an output which is coupled to the control connections of the second and third transistors, one input of the NOR gate and of the NAND gate in each case is supplied with the output signal from the buffer, and the respective other input is supplied with the delayed output signal, inverted with respect to the first input, from the buffer. Advantageously, the complexity of the circuitry required for producing the control circuit in this case is very low.

In accordance with an added feature of the invention, the buffer is formed by an inverter, since this guarantees optimum switching characteristics for the lowest degree of circuit complexity.

In accordance with a concomitant feature of the invention, the inverter includes a fifth transistor of the first conduction type and a sixth transistor of the second conduction type, the mutually coupled control connections of these transistors form the input of the inverter, the controlled paths of the transistors are connected in series with one another between the supply connections, and a tap between the two controlled paths forms the output of the inverter.

Other features which are considered as characteristic for the invention are set forth in the appended claims.

Although the invention is illustrated and described herein as embodied in a pulse shaper circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
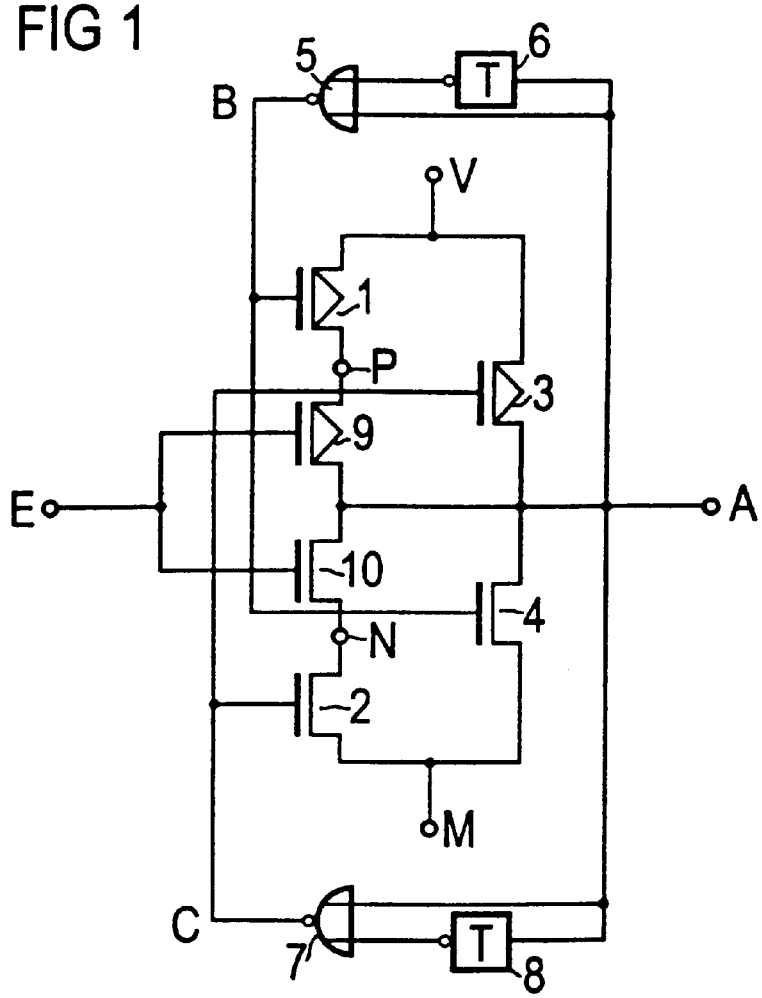
FIG. 1 is a schematic diagram of a first exemplary embodiment of a pulse shaper circuit according to the invention.

Referring now to the figures of the drawings in detail and first, particularly, to FIG. 1 thereof, there is seen an exemplary embodiment having an MOS field-effect transistor 1 of the p-channel type, which is operated as a controllable switch, and an MOS field-effect transistor 2 of the n-channel type, that is also operated as a switch. The transistors 1, 2 are each connected between a respective supply connection P, N of a buffer circuit and a respective supply potential V, M. The buffer circuit is formed by an inverter which has an MOS field-effect transistor 9 of the p-channel type and an MOS field-effect transistor 10 of the n-channel type. Drain connections of the two transistors 9 and 10 in this configuration are coupled to one another so as to form an output A of the pulse shaper circuit. An input E of the pulse shaper circuit is produced by mutually coupled gate connections of the two transistors 9 and 10.

Finally, the supply connections P, N of the inverter are provided by source connections of the transistors 9 and 10. Therefore, the source connection of the transistor 9 is wired through the controlled path of the transistor 1 to the first supply potential V, and the source connection of the transistor 10 is wired through the controlled path of the transistor 2 to the second supply potential M. Specifically, for this purpose the source connection of the transistor 9 and the drain connection of the transistor 1 are connected to one another, and the source connection of the transistor 10 and the drain connection of the transistor 2 are connected to one another. Consequently, a source connection of the transistor 1 is connected to the supply potential V, and a source connection of the transistor 2 is connected to the supply potential M.

Furthermore, a controlled path of an MOS field-effect transistor 3 of the p-channel type and a controlled path of an MOS field-effect transistor 4 of the n-channel type are respectively connected between the output A and the supply potential V and between the output A and the supply potential M. The connection is made in such a manner that respective drain connections are connected to the output A and respective source connections are connected to the supply potential V and to the supply potential M, respectively. In this case, gate connections of the transistors 1 and 4 are wired to one another and gate connections of the transistors 2 and 3 are wired to one another. The mutually coupled gate connections of the transistors 1 and 4 are controlled by an output B of a NOR gate 5. One input of the NOR gate 5 is directly connected to the output A and another input of the NOR gate 5 is connected to the output A with the interposition of an inverting delay element 6. The gate connections of the transistors 2 and 3 are connected to an output C of a NAND gate 7. One input of the NAND gate 7 is connected directly to the output A and another input of the NAND gate 7 is connected to the output A with the interposition of an inverting delay element 8. The MOSFETs 1, 2, 3 and 4 may be considered first, second, third and fourth controllable switches and the MOSFETs 9 and 10 may be considered fifth and sixth transistors. The elements 5, 6, 7 and 8 may be considered a control circuit.

Figure 2:
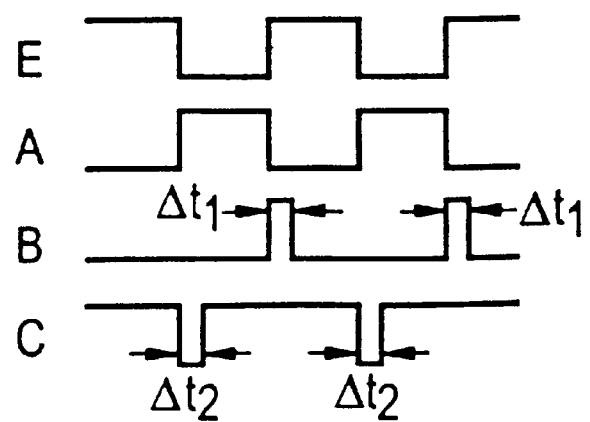
FIG. 2 is a timing diagram illustrating the way in which the circuit shown in FIG. 1 operates.

FIG. 2 illustrates the way in which the circuit shown in FIG. 1 operates. If a square-wave signal is fed to the input E, the output A produces a signal which is essentially the inverse of the square-wave signal. Due to the logic combination of the unprocessed output signal A and the temporally delayed, inverted output signal A, the output B of the NOR gate 5 produces a first control pulse of a duration $\Delta t_1$ after each falling edge of the output signal A and after each rising edge of the input signal E, respectively. Similarly, the output C of the NAND gate 7 produces second control pulses of a length $\Delta t_2$ with each falling edge of the signal at the input E and with a rising edge of the signal at the output A. Whereas the signal at the output B presents positive pulses, signals with negative pulses are produced at the output C. Using the respective pulses, the respective transistors 1 and 4, and 2 and 3 control the output A passively for a specific dead time, and the output A remains in the respective last state. Glitches occurring after switching edges are thus ignored.

Figure 3:
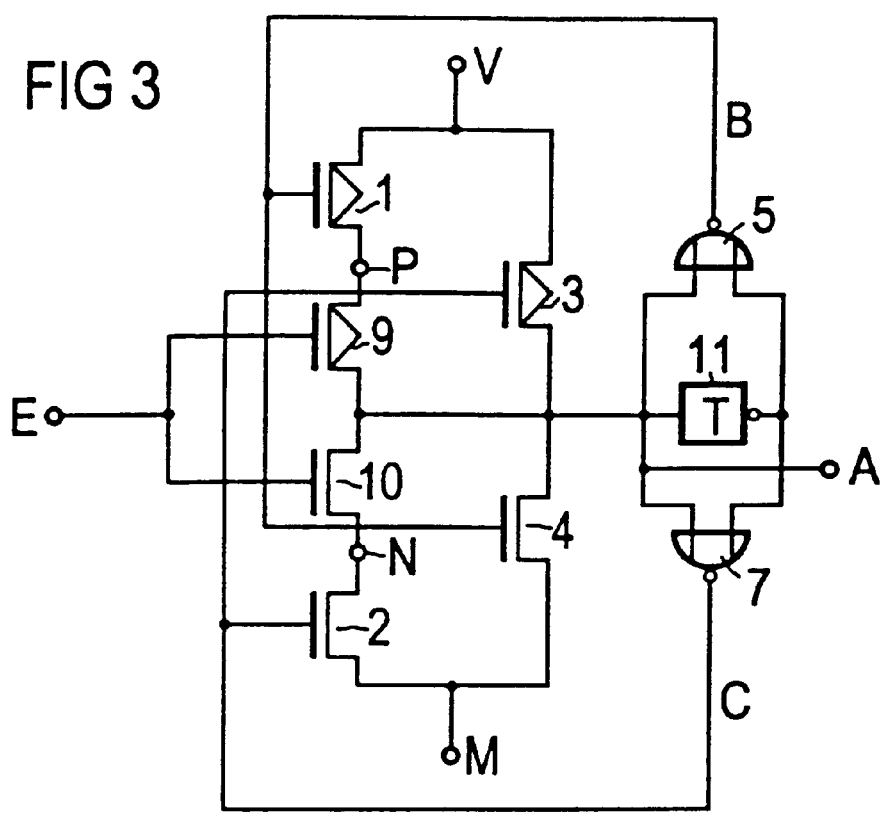
FIG. 3 is a diagram of a second exemplary embodiment of a pulse shaper circuit according to the invention.

The exemplary embodiment shown in FIG. 3 has been modified with respect to the example of FIG. 1 to the extent that only a single delay element 11 is used instead of the two delay elements 6 and 8. In addition, the inputs of the NOR gate 5 and of the NAND gate 7 are respectively connected in parallel with one another and to a respective input and output of the inverting delay element 11.

Figure 4:
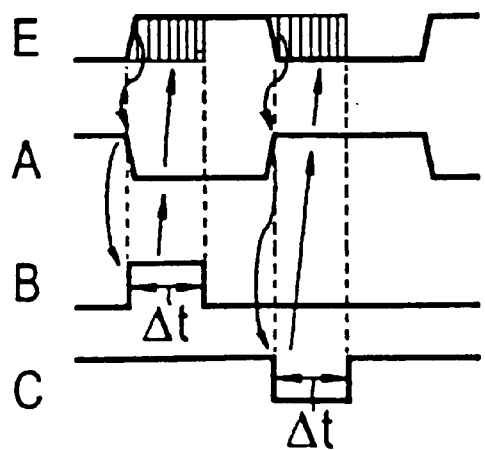
FIG. 4 is a timing diagram illustrating the way in which the circuit shown in FIG. 3 operates.

FIG. 4 shows that the way in which the circuit configuration according to FIG. 3 operates essentially corresponds to that shown in FIG. 1, except that a dead time $\Delta t$ in the case of the exemplary embodiment of FIG. 3 is determined only by the delay element 11, and is therefore essentially the same for both gates. In turn, FIG. 4 shows the signal at the input E and the inverse of this signal at the output A. The output B of the NOR gate 5 in this case produces a pulse of a length $\Delta t$ with each falling edge of the signal at the output A and with each rising edge of the signal at the input E. Accordingly, the output C of the NAND gate 7 produces a negative pulse of a length $\Delta t$ with each rising edge of the signal at the output A and with each falling edge of the signal at the input E. In the range in which one of the pulses at the output B or C is produced, changes in the signal at the input E are ignored.

We claim:

1. A pulse shaper circuit, comprising:

a buffer having an input, an output and two supply connections;

a controllable first switch connected between one of said supply connections and a first supply potential;

a controllable second switch connected between the other of said supply connections and a second supply potential;

a controllable third switch connected between said output of said buffer and the first supply potential;

a controllable fourth switch connected between said output of said buffer and the second supply potential; and control circuitry connected to said output of said buffer for controlling said switches, said control circuitry producing a first control pulse of a specific duration at an occurrence of first edges of a signal present at said output of said buffer, said first control pulse changing over said first switch from an ON state to an OFF state and changing over said fourth switch from an OFF state to an ON state, and said control circuitry producing second control pulse of a specific duration at an occurrence of second edges of the signal present at said output of said buffer, said second control pulse changing over said second switch from an ON state to an OFF state and changing over said third switch over from an OFF state to an ON state.

2. The pulse shaper circuit according to claim 1, wherein said first and third switches are respective first and third transistors of a first conduction type having control connections, said second and fourth switches are respective second and fourth transistors of a second conduction type having control connections, said control connections of said first and fourth transistors are connected to one another and are controlled by said first control pulse, and said control connections of said second and third transistors are connected to one another and are controlled by said second control pulse.

3. The pulse shaper circuit according to claim 2, wherein said control circuitry includes a NOR gate having inputs and having an output coupled to said control connections of said first and fourth transistors, said control circuitry includes a NAND gate having inputs and having an output coupled to said control connections of said second and third transistors, one of said inputs of said NOR gate and of said NAND gate are each supplied with an output signal from said buffer, and the other of said inputs of said NOR gate and of said NAND gate are each supplied with a temporally delayed, inverted output signal from said buffer.

4. The pulse shaper circuit according to claim 1, wherein said buffer is an inverter.

5. The pulse shaper circuit according to claim 4, wherein said inverter includes a fifth transistor of the first conduction type and a sixth transistor of the second conduction type, said fifth and sixth transistors having control connections coupled to one another to form an input of said inverter and having controlled paths connected in series with one another at a tap between said supply connections, and said tap forming an output of said inverter.

* * * * *